US010951441B2

(12) United States Patent
Reddy et al.

(10) Patent No.: US 10,951,441 B2
(45) Date of Patent: Mar. 16, 2021

(54) RECEIVER SYSTEMS AND METHODS FOR AC AND DC COUPLING OF RECEIVER

(71) Applicant: Samsung Electronics Co., Ltd., Suwon-si (KR)

(72) Inventors: A Santosh Kumar Reddy, Andhra Pradesh (IN); Sumanth Chakkirala, Bangalore (IN); Sunil Rajan, Bangalore (IN)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/538,071

(22) Filed: Aug. 12, 2019

(65) Prior Publication Data

US 2020/0403828 A1 Dec. 24, 2020

(30) Foreign Application Priority Data

Jun. 19, 2019 (IN) .............................. 201941024255

(51) Int. Cl.
| | | |
|---|---|---|
| *H04L 27/00* | (2006.01) | |
| *H04L 25/02* | (2006.01) | |
| *H03K 17/687* | (2006.01) | |
| *H04L 25/00* | (2006.01) | |
| *H03F 3/45* | (2006.01) | |

(52) U.S. Cl.
CPC ..... *H04L 25/0298* (2013.01); *H03K 17/6872* (2013.01); *H03F 3/45* (2013.01); *H04L 25/0294* (2013.01)

(58) Field of Classification Search
CPC .................. H04L 25/0298; H03K 17/6872
USPC .................................... 375/257, 316
See application file for complete search history.

(56) References Cited

U.S. PATENT DOCUMENTS

| | | | | |
|---|---|---|---|---|
| 7,519,130 B2* | 4/2009 | Hsu | ..................... | H04L 25/0274 |
| | | | | 326/30 |
| 9,048,999 B2 | 8/2015 | He et al. | | |
| 2005/0281343 A1* | 12/2005 | Hsu | ................... | H04L 25/03343 |
| | | | | 375/257 |

FOREIGN PATENT DOCUMENTS

KR 10-2012-0050420 A 5/2012

* cited by examiner

*Primary Examiner* — Tesfaldet Bocure
(74) *Attorney, Agent, or Firm* — Harness, Dickey & Pierce, P.L.C.

(57) ABSTRACT

An Alternating Current (AC) and Direct Current (DC) coupled electronic receiver system including a receiver, an AC-coupling capacitor between an input of the receiver system and the receiver, a bypass switch configured to selectively bypass the AC-coupling capacitor to DC-couple the input to the receiver, a bypass switch driving circuit configured to cause the bypass switch to switch 'ON' and thereby DC-couple the input to the receiver, and cause the bypass switch to switch 'OFF' and thereby AC-couple the input to the receiver, and a voltage-following transistor between a source and a gate of the bypass switch configured to maintain an 'OFF' state of the bypass switch while the input is AC-coupled.

16 Claims, 18 Drawing Sheets

RECEIVER SYSTEMS AND METHODS FOR AC AND DC COUPLING OF RECEIVER

CROSS-REFERENCE TO RELATED APPLICATIONS

This application claims priority under 35 U.S.C. § 119 to Indian Patent Application No. 201941024255 filed on Jun. 19, 2019, in the Korean Intellectual Property Office, the disclosure of which is incorporated by reference herein in its entirety.

FIELD

The present subject matter relates to electronic transceivers and/or receivers and in particular relates to alternating current/direct current (AC/DC) coupling interfaces with respect to said transceivers and/or receivers.

BACKGROUND

Contemporary electronic-communication systems provide high-speed data-communication between two devices, e.g. between transmitter and receiver (e.g., in the order of gigahertz frequency range). For such purposes, the communication system usually comprises a transmitter at a first-device and a receiver at a second-device. In operation, the transmitter transmits high-speed data to the receiver over one or more channels. For example, the first and second devices may be on separate chips mounted on a board, in which the communication system comprises a differential channel and AC-coupling capacitors on the board. In this example, the transmitter may transmit high-speed data to the receiver over the differential channel and AC-coupling capacitors.

When it comes to a combination of AC and DC coupling, a serial input/output (I/O) receiver may be provided with both AC-coupling and DC-coupling mode reception through two different-paths, one for AC mode reception and one for DC mode reception. The use of separate-paths is normally addressed by combining both AC and DC paths through a bypass-switch across the AC-coupling capacitor. The coupling-interface to the receiver may be ground-terminated or supply-terminated.

For the receiver with grounded-termination or supply termination, the bypass-switch suffers from shortcomings. As indicated in FIG. 1, in AC coupling mode with grounded termination, the bypass switch does not get completely turned OFF for negative-inputs or positive excursion (whichever applicable), which alters an average of the received input signal, thereby leading to wrong or inaccurate-reception. The same has been depicted with respect to FIG. 1, wherein it is clear that gate-voltage with respect to the bypass-switch does not follow the AC input signal. Accordingly, the bypass switch automatically turns ON during negative input, thereby resulting in corrupted AC output (e.g. distorted average). Likewise, for the receiver with supply-termination, the bypass-switch exhibits similar shortcomings during the positive excursions.

Further, during the DC-mode and in respect of ground-termination, the bypass switch is ON and there always remains a limit on a higher-value of input voltage for reliability of operation of the bypass-switch. Such constraint is also observed for AC-coupled systems especially when the bypass switch remains ON for bypassing the internal-AC coupling or the AC capacitor. Likewise, for the receiver with supply-termination, the present bypass-switch exhibits similar shortcomings during the DC mode.

In order to address the aforesaid constraint, FIG. 2 illustrates a prior art serial I/O receiver with a common path for AC & DC coupling and having referenced-termination. The same involves generation of a higher receiver (Rx) common mode using a regulator-amplifier. More specifically, a finite bias (Vb) is used to increase the input common mode to avoid negative signal-excursion. The present scheme of FIG. 2 relies on the common mode voltage support based on the supply voltage. The shift in common mode affects the positive input as well. Hence there is always a limit to the common mode applied. The output impedance of the buffer is low because the buffer is in series with the receiver termination of 50 Ohms. Overall, the prior art mechanism uses an additional voltage regulator and limitation on the input-swing. More specifically, the prior art scheme incurs additional ON-chip area and consumes substantial power.

Another prior art mechanism has been illustrated in FIGS. 3A and 3B, wherein the serial I/O receiver with a common path for AC and DC coupling is provided with grounded termination with a C-R filter equipped bypass switch. The C-R filter couples both source and gate of the bypass NMOS switch to turn the gate-source voltage to zero, which in turn suppresses a negative-pulse. More specifically, with the grounded termination system, the addition of a C-R high pass filter (shown in FIG. 3B) between i) the bypass switch, and ii) source to gate terminals addresses negative-excursions. However, such scheme uses higher-silicon area for lower data rates and ends up occupying high ON chip area. Higher capacitance on the DP/DN lines impact the return loss and degrades the receiver performance for high speed modes of operation. There is limitation on the lower data-rate supported as the capacitance value increases based on the filter cut-off.

Accordingly, it would be desirable to achieve area and power advantages with respect to conventional serial I/O receivers incorporating single path AC-DC coupling.

It would be desirable to achieve said serial I/O receivers as independent of input operating data-rate and thereby support higher input-swings.

SUMMARY

This summary is provided to introduce a selection of concepts in a simplified format that are further described in the detailed description of the present disclosure. This summary is not intended to identify key or essential inventive concepts of the claimed subject matter, nor is it intended for determining the scope of the claimed subject matter.

The present subject matter at-least describes an Alternating Current (AC) and Direct Current (DC) coupled electronic receiver system. The receiver system includes a receiver, an AC-coupling capacitor between an input of the receiver system and the receiver, a bypass switch configured to selectively bypass the AC-coupling capacitor to DC-couple the input to the receiver, a bypass switch driving circuit configured to cause the bypass switch to switch 'ON' and thereby DC-couple the input to the receiver, and cause the bypass switch to switch 'OFF' and thereby AC-couple the input to the receiver, and a voltage-following transistor between a source and a gate of the bypass switch configured to maintain an 'OFF' state of the bypass switch while the input is AC-coupled.

Further, the present subject matter at-least describes a method of implementing Alternating Current (AC) and Direct Current (DC) coupling in a receiver. The method includes controlling DC and AC coupling of an input of the receiver by causing a bypass switch to switch to an 'ON' state and an 'OFF' state using a bypass switch driver circuit, the bypass switch being configured to bypass an AC-coupling capacitor coupled to the input, and causing the bypass switch to maintain the 'OFF' state during the AC coupling of the input using a voltage-following transistor between a source and a gate of the bypass switch, the voltage-following transistor being a grounded gate transistor or a transistor having a gate connected to a supply voltage.

To further clarify advantages and features of the present invention, a more particular description of the invention will be rendered by reference to specific embodiments thereof, which is illustrated in the appended drawing. It is appreciated that these drawings depict only typical embodiments of the invention and are therefore not to be considered limiting its scope. The invention will be described and explained with additional specificity and detail with the accompanying drawings.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

Figure 1:
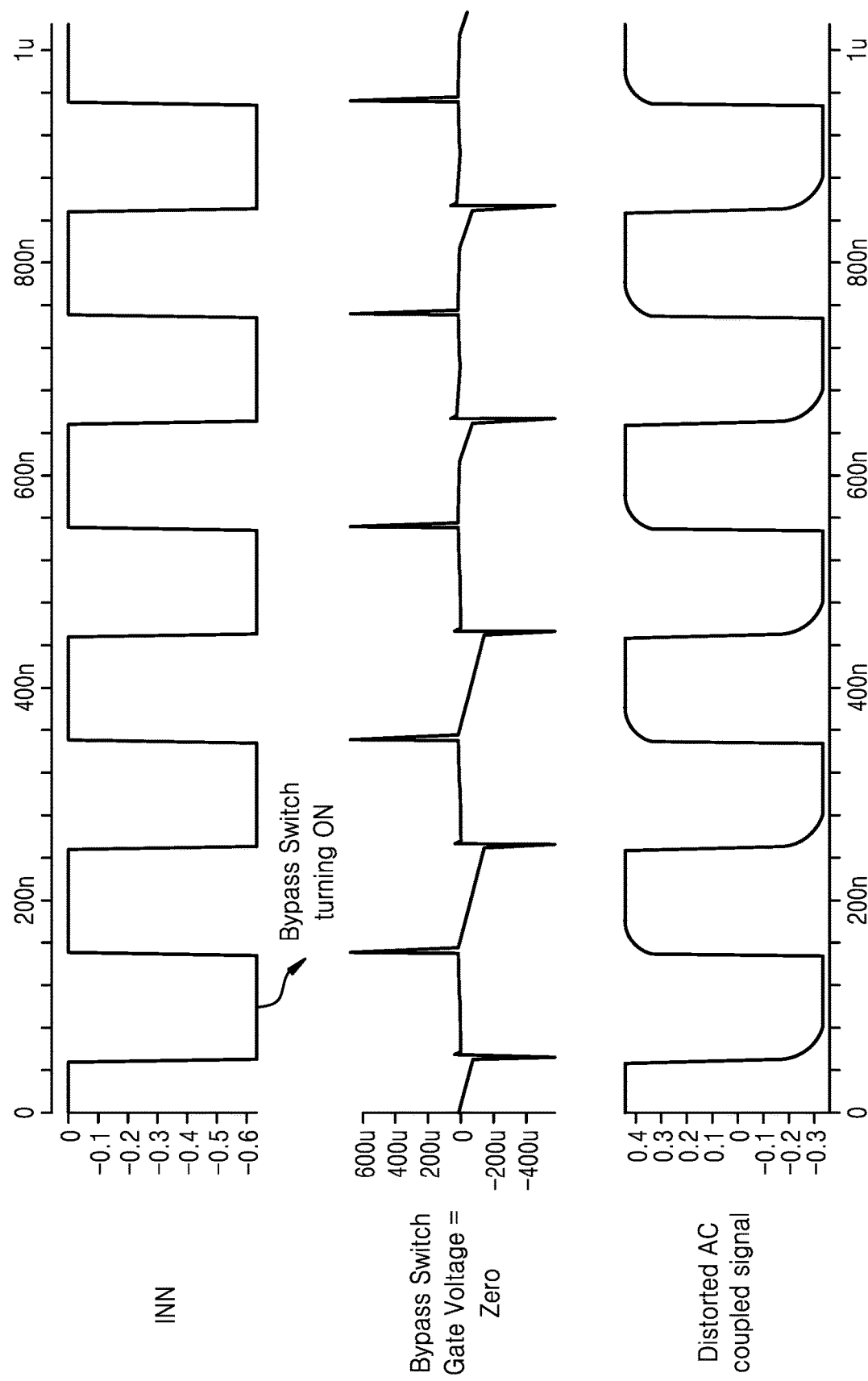
FIG. 1 illustrates variation of gate-voltage of the bypass-switch NO, wherein the variation of the fate-voltage is not in accordance with the input-signal (e.g., source voltage), in accordance with a prior art arrangement shown in FIG. 3A.
Figure 2:
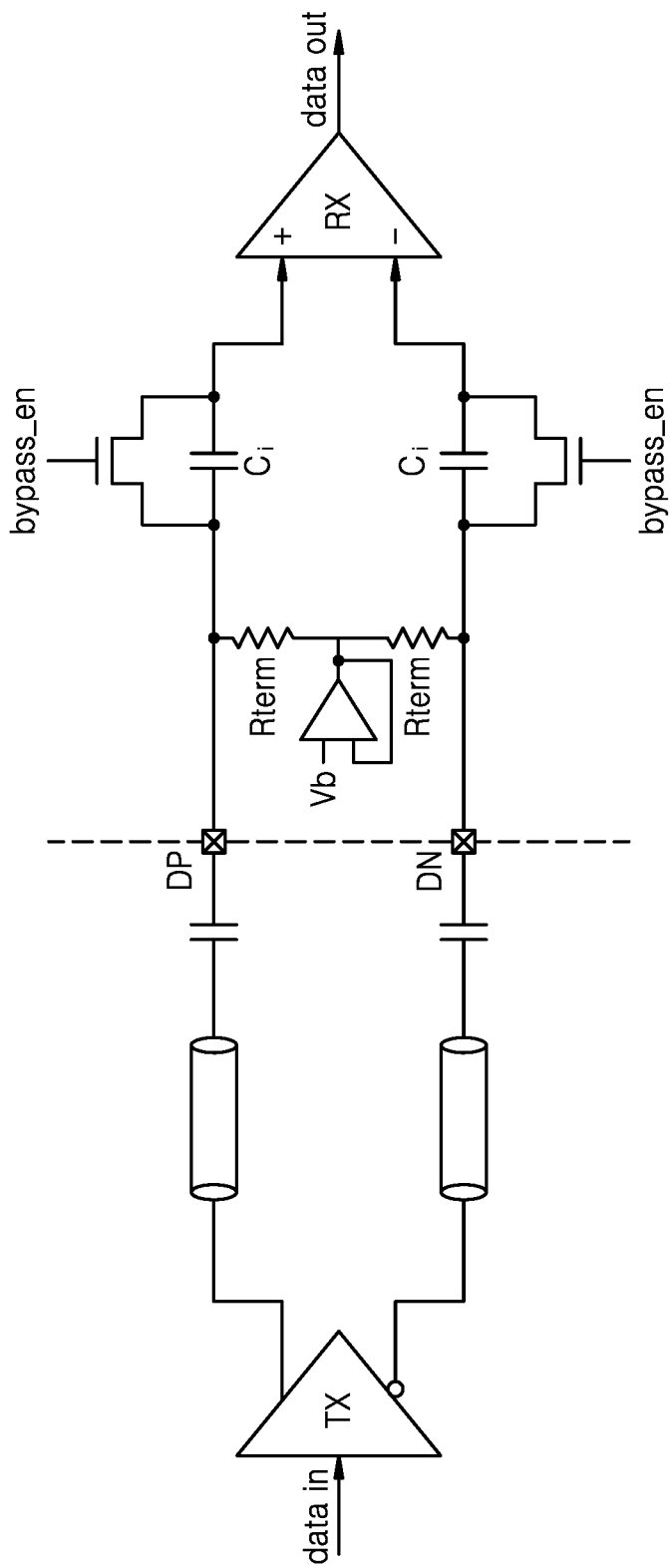
FIG. 2 illustrates a prior art mechanism for AC/DC coupling of receiver circuit.
Figure 3A:
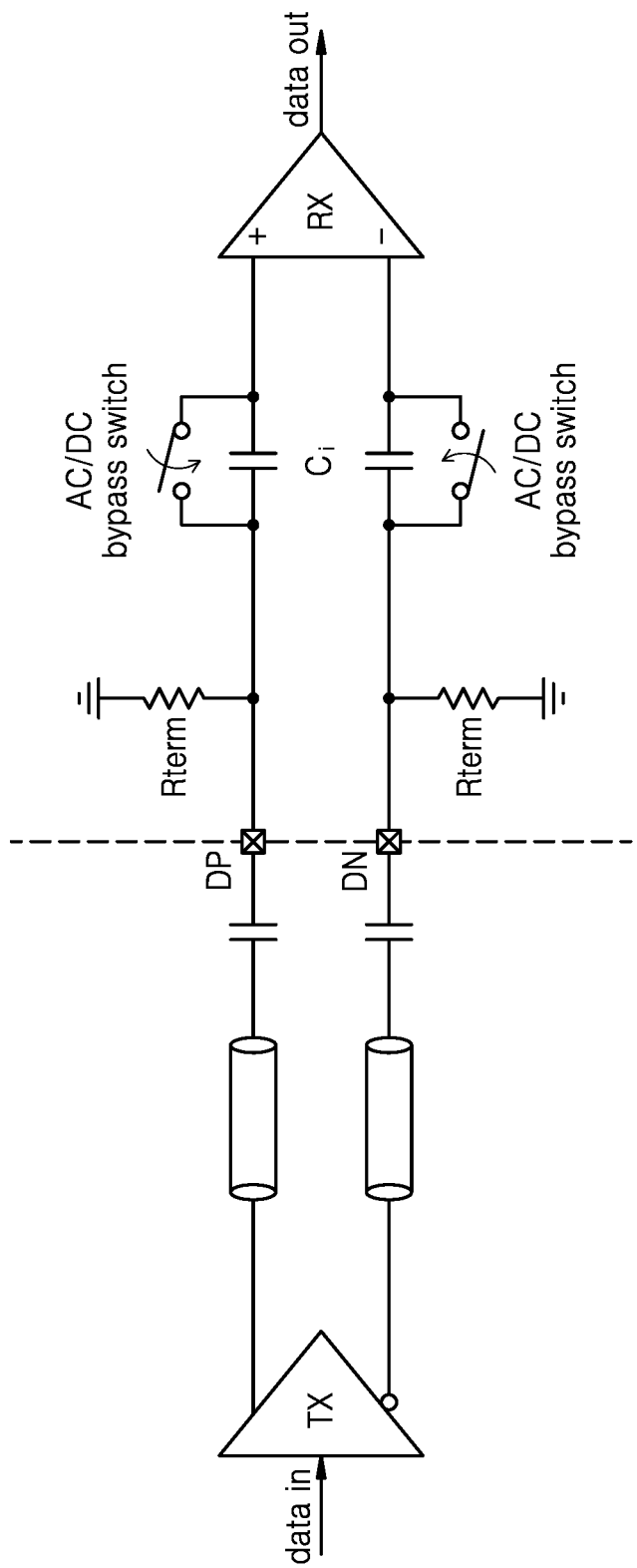
FIGS. 3A and 3B illustrate another prior art mechanism for AC/DC coupling of receiver circuit.
Figure 3B:
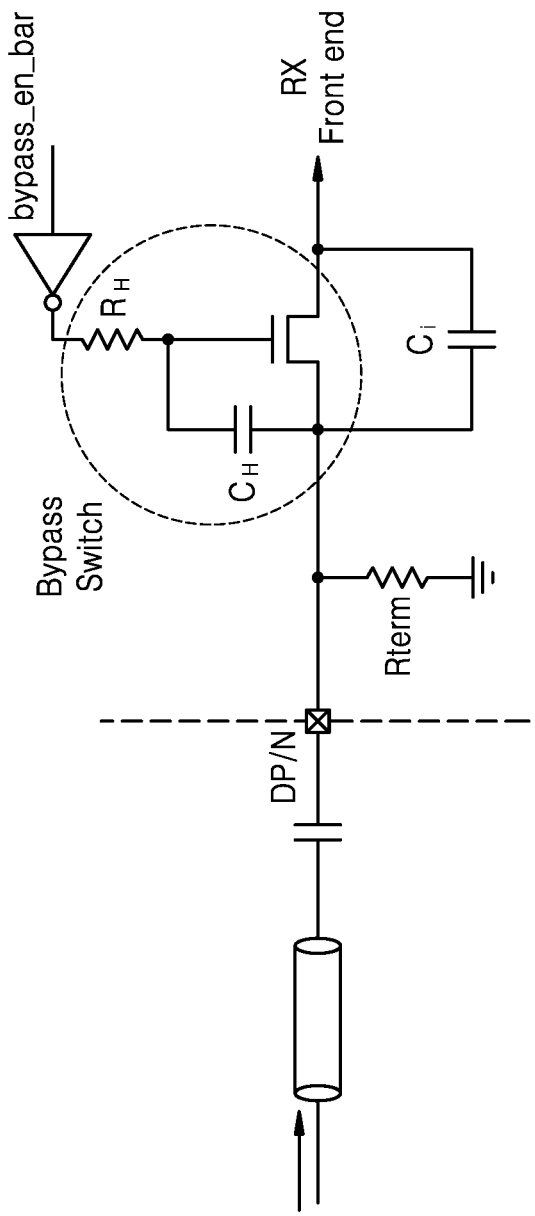

Further, skilled artisans will appreciate that elements in the drawings are illustrated for simplicity and may not have been necessarily been drawn to scale. For example, the flow charts illustrate the method in terms of the most prominent operations involved to help to improve understanding of aspects of the present invention. Furthermore, in terms of the construction of the device, one or more components of the device may have been represented in the drawings by conventional symbols, and the drawings may show only those specific details that are pertinent to understanding some example embodiments of the present invention so as not to obscure the drawings with details that will be readily apparent to those of ordinary skill in the art having benefit of the description herein.

DETAILED DESCRIPTION

For the purpose of promoting an understanding of the principles of the invention, reference will now be made to some example embodiments illustrated in the drawings and specific language will be used to describe the same. It will nevertheless be understood that no limitation of the scope of the invention is thereby intended, such alterations and further modifications in the illustrated system, and such further applications of the principles of the invention as illustrated therein being contemplated as would normally occur to one skilled in the art to which the invention relates.

It will be understood by those skilled in the art that the foregoing general description and the following detailed description are explanatory of the invention and are not intended to be restrictive thereof.

Reference throughout this specification to "an aspect", "another aspect" or similar language means that a particular feature, structure, or characteristic described in connection with an embodiment is included in at least one embodiment of the present invention. Thus, appearances of the phrase "in an embodiment", "in some example embodiments" and similar language throughout this specification may, but do not necessarily, all refer to the same embodiment.

The terms "comprises", "comprising", or any other variations thereof, are intended to cover a nonexclusive inclusion, such that a process or method that comprises a list of operations does not include only those operations but may include other operations not expressly listed or inherent to such process or method. Similarly, one or more devices or subsystems or elements or structures or components proceeded by "comprises . . . a" does not, without more constraints, preclude the existence of other devices or other sub-systems or other elements or other structures or other components or additional devices or additional sub-systems or additional elements or additional structures or additional components.

Unless otherwise defined, all technical and scientific terms used herein have the same meaning as commonly understood by one of ordinary skill in the art to which this invention belongs. The system, methods, and examples provided herein are illustrative only and not intended to be limiting.

Embodiments of the present invention will be described below in detail with reference to the accompanying drawings.

Figure 4:
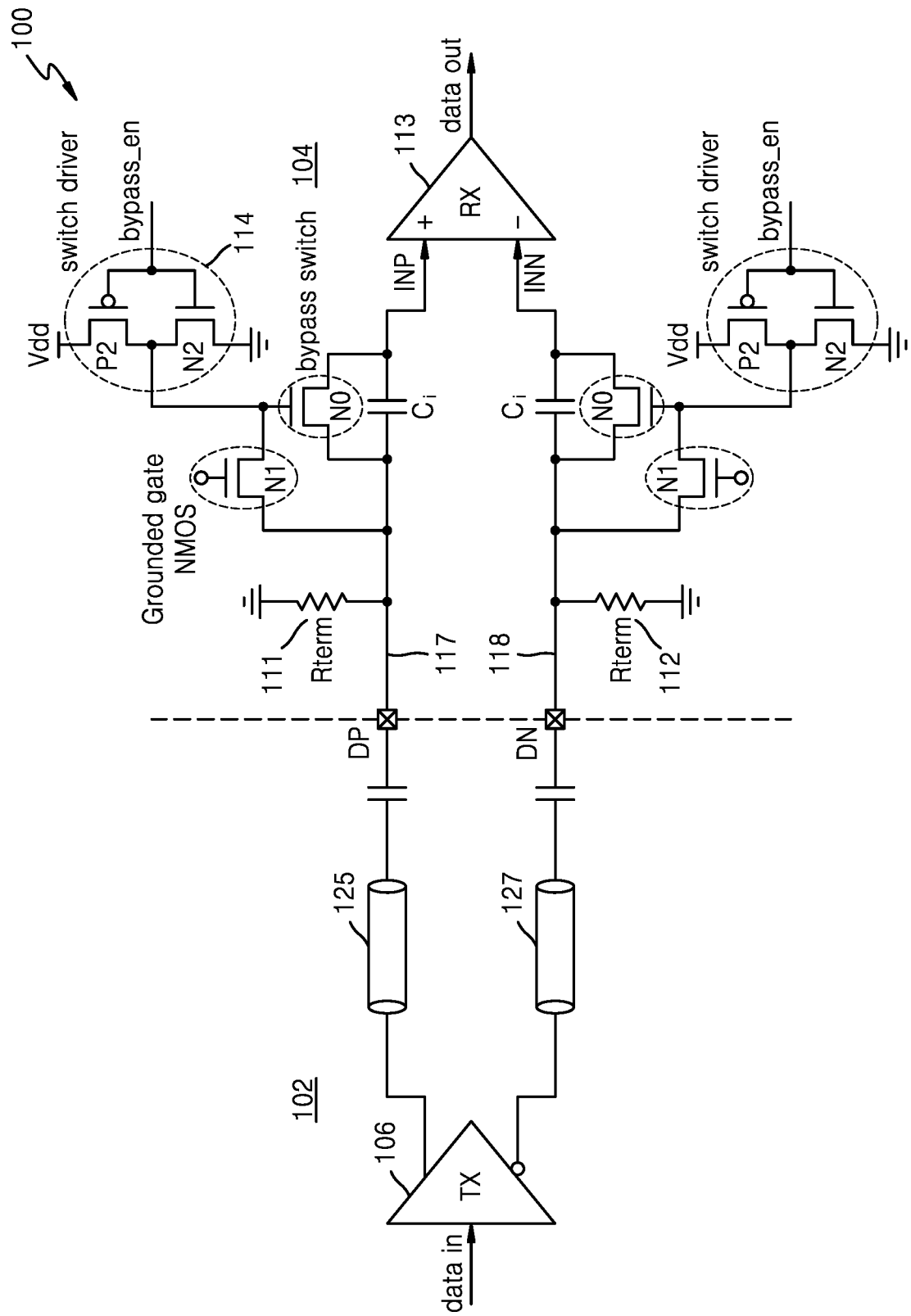
FIG. 4 is a schematic-diagram illustrating the Alternating Current (AC) and Direct Current (DC) coupled electronic receiving-system, in accordance with an embodiment of the present subject matter.

FIG. 4 is a schematic-diagram illustrating an Alternating Current (AC) and Direct Current (DC) coupled electronic receiving-system. The receiving-system may be based on a receiver-termination-network 100 that includes internal AC-coupling capacitors $C_i$ integrated as part of the receiver-circuitry. The present FIG. 4 further includes a transmitter-circuitry to the extent-useful for describing the operation of the receiver circuitry.

The receiver termination network 100 (also referred to herein as a "network," a "receiving termination network," a "termination-network," a "termination network" and/or a "receiver-termination network") comprises a transmit (TX) portion 102 and/or a receive (RX) portion 104 connected by a transmission-medium comprising differential transmission line-segments 125 and/or 127. The RX portion 104 is connected to the transmission line segments 125 and/or 127 over connections 117 and/or 118 (also referred to as "inputs"), respectively. The transmit portion 102 comprises a transmit driver 106. The transmit driver 106 may deliver a differential transmit-signal to a terminated receiver. In an example and without limiting the scope of the present subject matter, the DC current through each resistor 111 and 112 $R_{term}$ may be given by Icm=Vcm/Rt, where Icm is the common mode transmit current, Vcm is the common mode voltage of the differential signals, and Rt is the resistance value of the resistors 111 and 112.

The signal INP is the positive transmit signal, also referred to as an input signal, provided to a non-inverting end of a receiver 113. The receiver 113 may be a differential-amplifier. In another example, the operational amplifier (op-amp) referred by 113 may be a comparator which is connected to a further receiving-stage. Accordingly, the receiver 113 may be at least one of an amplifier, a differential amplifier, a comparator, and/or a combination of comparator and amplifier. For example, the receiver 113 may be at least one of an operational amplifier, a differential amplifier, a comparator, and/or a combination of comparator and operational amplifier.

On the other hand, the signal INN is the negative transmit signal, also referred to as an input signal, provided to an inverting end of the receiver 113. The terms "positive" and "negative" are relative because the signals INP and INN represent the components of a differential signal that exist around the common mode voltage, Vcm.

The receiver termination resistors 111 and 112 $R_{term}$ terminate the INP/INN signal to an AC-ground. The values of the resistors 111 and 112 $R_{term}$ are chosen to represent the impedance of the transmission medium, comprising transmission line segments 125 and 127, which separate the transmit portion 102 from the receive portion 104 by a distance. In an embodiment, the value of each resistor 111 and 112 $R_{term}$ is nominally 50 ohms. Further, in respect of present FIG. 4, the resistors 111 and 112 are ground-terminated.

The receiver or RX portion 104 comprises internal AC coupling capacitors Ci, associated with the transmission line segments 125 and 127. The AC-coupling capacitors Ci are coupled between the inputs (e.g., connections 117 and/or 118) and the receiver 113. In an embodiment, the internal AC coupling capacitors Ci are integrated with, formed in, or otherwise associated with the circuitry that is used to fabricate the receiver portion (e.g., the receive portion) 104. In an embodiment, the value of the internal AC coupling capacitors Ci is of the order of 100 femto-farads (fF).

Further, a bypass-switch N0 (also referred to herein as a "bypass transistor" and/or "N0") is provided for bypassing the AC-coupling capacitor Ci and thereby DC-coupling the receiver input 117 to the receiver 113 and accordingly enable reception of the INP signal at the receiver portion 104. A bypass-switch driving circuit 114 (also referred to herein as a "switch driver circuit" or a "bypass switch driver circuit") may be provided for switching 'ON' and 'OFF' the bypass switch N0 and thereby selectively enable DC-coupling and/or AC-coupling of the input 117 to the receiver 113. The bypass switch N0 may be at least one of an n-channel transistor, a p-channel transistor, and/or a complementary metal-oxide-semiconductor field-effect transistor (MOSFET) (CMOS). Although the bypass-switch N0 and the bypass-switch driving circuit 114 are discussed above as DC-coupling the input 117 to the receiver 113 and accordingly enable reception of the INP signal at the receiver portion 104, as depicted in FIG. 4, another bypass-switch N0 and/or another bypass-switch driving circuit 114 may be provided for DC-coupling the input 118 to the receiver 113 and accordingly enable reception of the INN signal at the receiver portion 104. The bypass-switch N0 is similar to or the same as the other bypass-switch N0, and the bypass-switch driving circuit 114 is similar to or the same as the other bypass-switch driving circuit 114.

Further, a transistor N1 (also referred to herein as a "voltage-following transistor," a "grounded-gate transistor," a "grounded gate transistor," an "N1" and/or an "N1 transistor") may be provided between a source and a gate of the bypass switch N0 to maintain an 'OFF' state of the bypass switch N0 while the input 117 is AC-coupled and to maintain an 'ON' state of the bypass switch N0 when the input 117 is DC-coupled. In an embodiment, the transistor N1 may be a grounded gate n-channel transistor. The n-channel transistor N1 during the ON state may short source and gate terminals of the bypass transistor N0 and thereby renders a conducting path there-between. As depicted in FIG. 4, another transistor N1 may be provided between a source and a gate of the other bypass switch N0 to maintain an 'OFF' state of the other bypass switch N0 while the input 118 is AC-coupled and to maintain an 'ON' state of the other bypass switch N0 when the input 118 is DC-coupled. The transistor N1 is similar to or the same as the other transistor N1.

In case of the aforesaid grounded termination in the present FIG. 4, the termination resistors 111 and 112 $R_{terms}$ each may have a first-end coupled to the receiver system inputs 117 and 118, respectively, and a second end that is grounded. The grounded-termination may create negative input-excursions (e.g., voltage spikes) during which the n-channel transistor N1 switches 'ON' to short 'gate' and 'source' terminals of the bypass switch N0 and thereby maintains a zero gate-source voltage (e.g., VGS) with respect to the bypass switch N0.

In an embodiment, the n-channel transistor (N1) may be sized by a defined scale (for example, 4 times greater) with respect to the bypass switch (N0) and/or selected as a transistor having a low threshold-voltage from amongst a plurality of devices. Such configuration of the transistor N1 enables switching ON the transistor N1 prior to the bypass switch (N0) to maintain OFF state of the bypass switch (N0) during negative-excursion at the receiver inputs 117 and/or 118.

Figure 5:
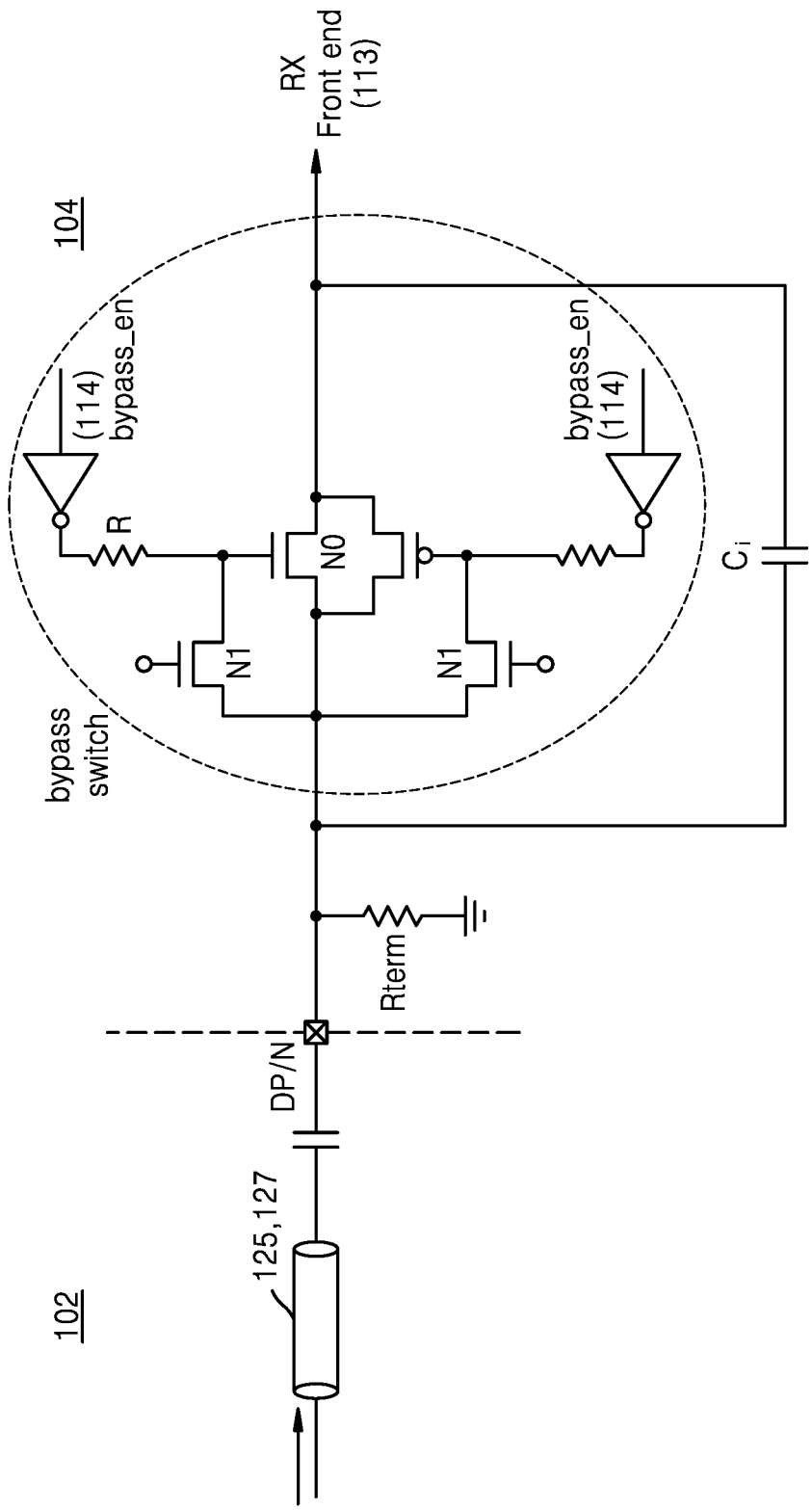
FIG. 5 illustrates another implementation of the bypass switch NO with respect to the ground-terminated network of FIG. 4, in accordance with an embodiment of the present subject matter.

FIG. 5 illustrates another implementation of the bypass switch N0 with respect to the ground-terminated network of FIG. 4, such that the bypass switch N0 is configured as a CMOS Transmission Gate. With respect to OFF state (e.g., bypass_en=0 for the switch driver circuit 114), the n-channel MOSFET (nMOS) and p-channel MOSFET (pMOS) within the transmission gate (e.g., the bypass switch N0) do not conduct to maintain the bypass switch N0 as OFF. When bypass_en=1, both pMOS and nMOS conduct to put the bypass switch N0 in ON state.

Figure 6:
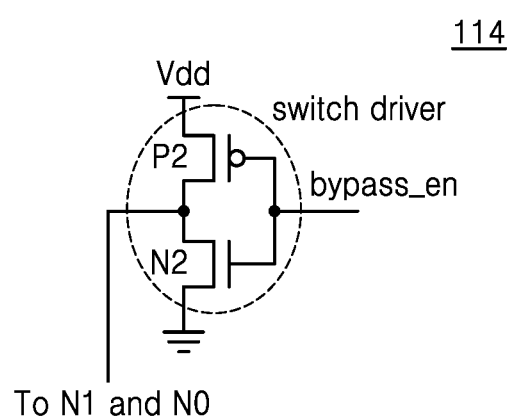
FIG. 6 illustrates a bypass-switch driving circuit, in accordance with an embodiment of the present subject matter.

FIG. 6 illustrates the bypass-switch driving circuit 114 (and/or the other bypass-switch driving circuit 114) as provided for switching 'ON' and 'OFF' the bypass switch N0. In an embodiment, the bypass switch driver circuit 114 may be an inverter-circuit comprising an n-channel transistor (N2) (also referred to herein as an "n-channel inverter transistor," a "transistor N2" and/or "N2") and a p-channel transistor (P2) (also referred to herein as an "p-channel inverter transistor," a "transistor P2" and/or "P2").

In respect of the AC-coupling of the receiver and presence of the grounded-gate transistor N1, the transistor N2 within the inverter circuit may be sized in accordance with a defined criteria to enable the gate-voltage in respect of the bypass switch (N0) to follow the source-voltage. Such defined criteria in respect of AC-coupling is defined as one or more of:

i) sizing the transistor (N2) lower than the transistor (N1) to exhibit a lower drive-strength;

ii) providing a resistance (e.g., resistor) in series with the transistor (N2) for lowering the drive-strength thereof in comparison to the transistor (N1); and/or iii) providing a resistor in series with inverter-circuit.

In respect of the DC-coupling of the receiver and presence of the grounded-gate transistor (N1), the transistor P2 within the inverter-circuit may be sized in accordance with a defined criteria to enable the gate-voltage of the bypass switch N0 to follow the source-voltage and thereby maintain the gate-source voltage (VGS) with respect to the bypass switch (N0) within reliability-limits (e.g., a defined upper and/or lower voltage limit). Such defined criteria in respect of DC-coupling is defined as one or more of:

iv) sizing the transistor (P2) lower than the transistor (N1) to exhibit a lower drive-strength;

v) providing a resistance (e.g., resistor) provided in series with the transistor (P2) for lowering the drive-strength thereof in comparison to the transistor (N1); and/or vi) providing a resistor (e.g., the resistor of sizing-criterion (iii)) provided in series with inverter-circuit.

The bypass switch driving circuit 114 may be controlled by a control-circuit and/or a logic circuit. Said logic circuit according to embodiments of the present disclosure may be implemented with at least one general-purpose processor, digital signal processor (DSP), application specific integrated circuit (ASIC), field programmable gate array (FPGA) and/or other programmable logic device, discrete hardware components, or any combination thereof designed to perform the functions described herein. A general-purpose processor may be a microprocessor, but in the alternative, the processor may be any conventional processor, controller, microcontroller, and/or state machine. A processor may perform the functions described herein (e.g., providing one or more control signals to the bypass switch driving circuit 114) by executing software comprising code for performing the functions. The software may be stored on a non-transitory computer-readable storage medium, such as a random access memory (RAM), a read-only memory (ROM), an electrically-erasable programmable ROM (EEPROM), an optical disk, and/or a magnetic disk.

Figure 7A:
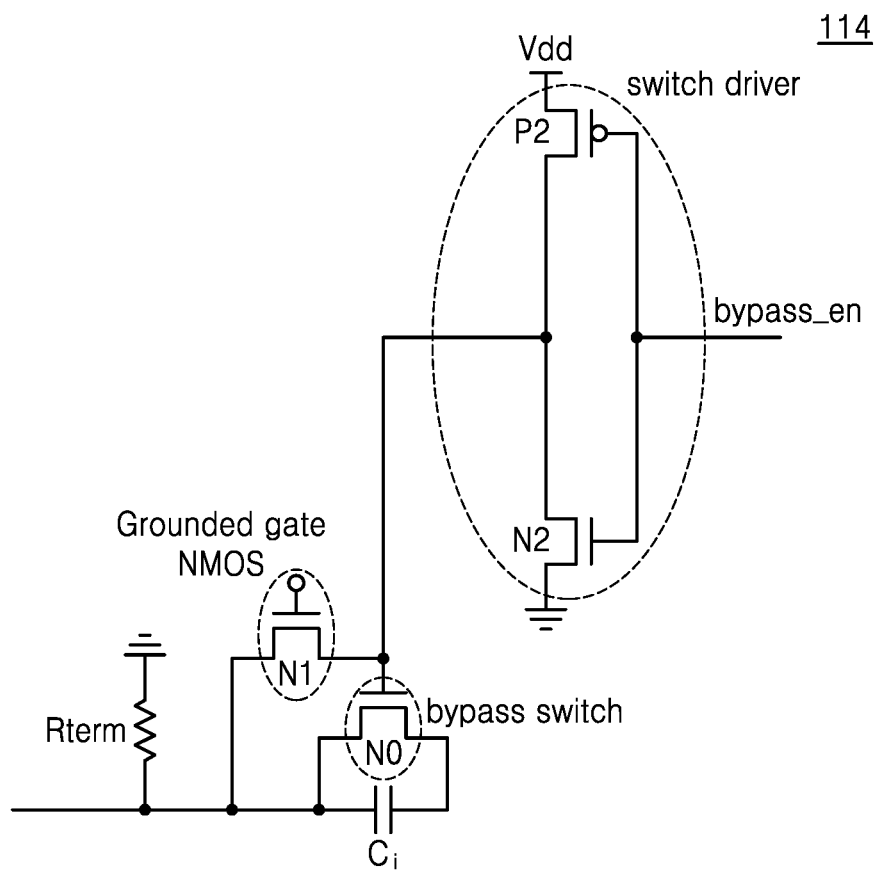
FIGS. 7A and 7B illustrate the sizing of the transistors forming a part of the bypass-switch driving circuit as illustrated in FIG. 6, in accordance with an embodiment of the present subject matter.
Figure 7B:
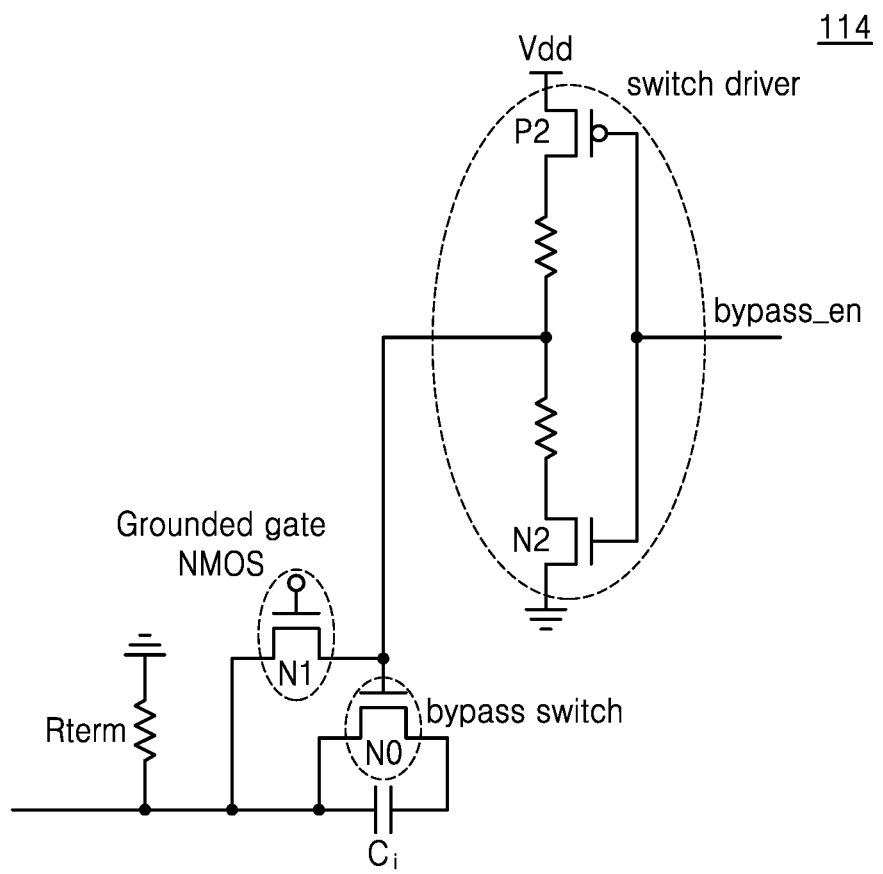

FIGS. 7A and 7B illustrate the sizing of the transistor N2 and the transistor P2 forming a part of the bypass-switch driving circuit 114 as illustrated in FIG. 6. FIG. 7A illustrates a plain-inverter configuration with transistor P2 and transistor N2 sizing, thereby diagrammatically depicting the sizing-criteria (i) and (iv) of FIG. 6. FIG. 7B illustrates the transistor P2 and the transistor N2 with series-resistors (e.g., resistors in series with the transistors), thereby diagrammatically depicting the sizing-criteria (ii) and (v) of FIG. 6.

Figure 8A:
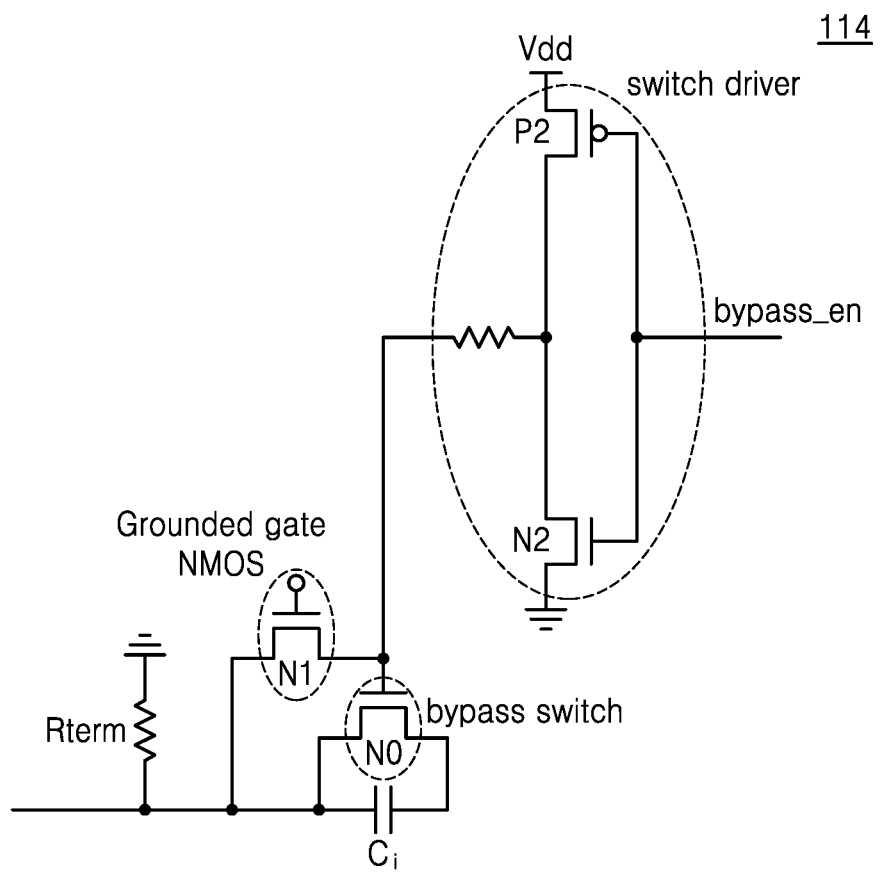
FIGS. 8A and 8B illustrate the sizing of the transistors forming a part of the bypass-switch driving circuit as illustrated in FIG. 6, in accordance with an embodiment of the present subject matter.
Figure 8B:
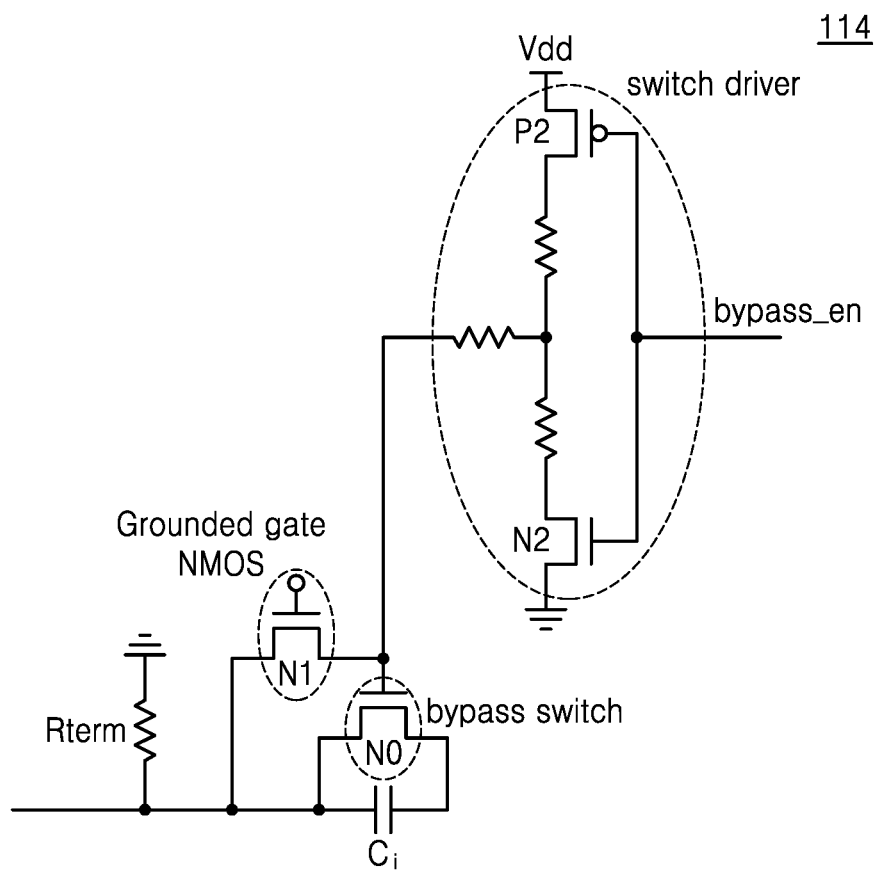

FIGS. 8A and 8B further illustrate the sizing of the transistor N2 and the transistor P2 forming a part of the bypass-switch driving circuit 114 as illustrated in FIG. 6. FIG. 8A illustrates "a common resistor at inverter output" based configuration, thereby diagrammatically depicting the sizing-criteria (iii) and (vi) of FIG. 6. FIG. 8B illustrates the transistor P2 and the transistor N2 with series-resistors, thereby diagrammatically depicting a combination of sizing-criteria (ii)-(iii) and (v)-(vi) as depicted in FIG. 7B and FIG. 8A.

Figure 9A:
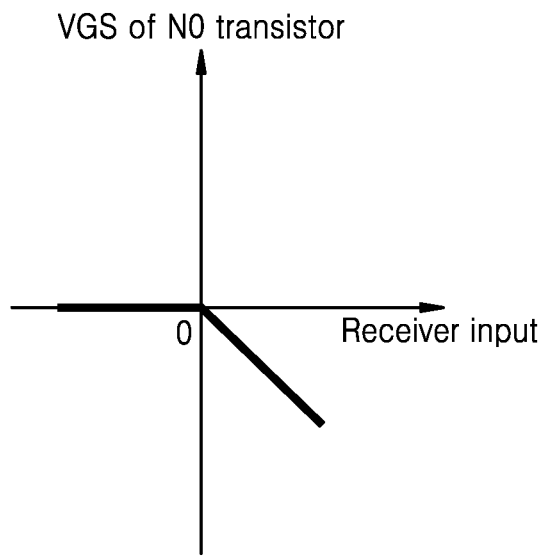
FIGS. 9A and 9B illustrate an example operation of the bypass switch NO, the grounded gate transistor (N1) and the bypass switch driver-circuit forming a part of the network 100 in FIG. 4, in accordance with an embodiment of the present subject matter.
Figure 9B:
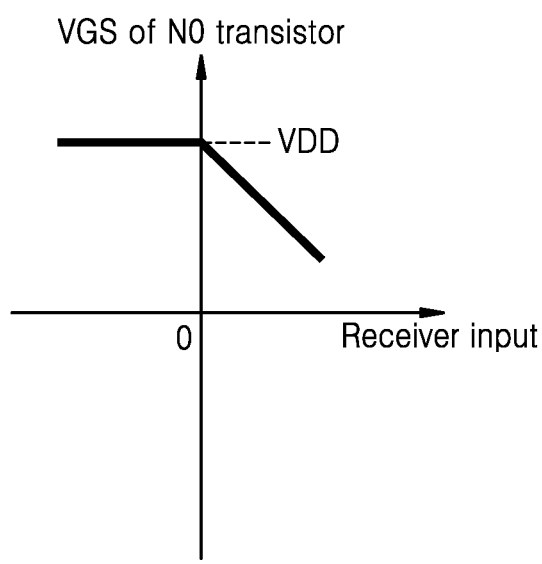

FIGS. 9A and 9B illustrate example operations of the bypass switch N0, the grounded-gate transistor (N1) and the bypass switch driver-circuit 114 forming a part of the network 100 in FIG. 4. Such operations may be categorized as AC and DC modes of operation.

Under the AC mode of operation as depicted in FIG. 9A, the receiver-input (e.g., inputs 117 and/or 118) to the bypass switch N0 is a source-node of bypass switch N0. When the receiver-input (e.g., input voltage) is positive and increasing, then the N1 transistor does not turn ON. Accordingly, the gate of the bypass switch N0 is fixed at zero. As source-voltage increases, the gate-source voltage (e.g., VGS) with respect to the bypass switch N0 reduces. When the receiver-input (e.g., input voltage) is negative and increasing, then the N1 transistor turns ON. Accordingly, the gate of the bypass switch N0 follows the source voltage, thereby rendering the VGS as zero, and in turn maintaining OFF state of the bypass switch N0 during negative excursion.

Under DC mode of operation as depicted in FIG. 9B, the receiver input (e.g., inputs 117 and/or 118) to the bypass switch N0 is a source-node of bypass switch N0. When said receiver input (e.g., input voltage) is positive and increasing, then the N1 transistor does not turn ON. The gate of the bypass switch N0 is fixed at supply. As source-voltage increases, the VGS of the bypass switch N0 reduces. When the receiver input (e.g., input voltage) is negative and increasing, then the N1 transistor turns ON. Accordingly, the gate of the bypass switch N0 follows the source-voltage so that VGS is limited to the supply voltage. Accordingly, VGS across the bypass switch N0 is maintained within reliability limits during negative excursion and the ON state of the bypass switch N0 is maintained.

The following Table 1 summarizes the aforesaid operation of present FIGS. 9A and 9B.

TABLE 1

| Mode | N0 | N1 | N2 | P2 | |
|---|---|---|---|---|---|
| AC mode | OFF | OFF | ON | OFF | N1 switches ON for negative excursions |
| DC mode | ON | OFF | OFF | ON | |

TABLE 1-continued

| Mode | N0 | N1 | N2 | P2 |
|------|----|----|----|----|
|      |    |    |    | so that N0 gate & source are tracked |

Figure 10:
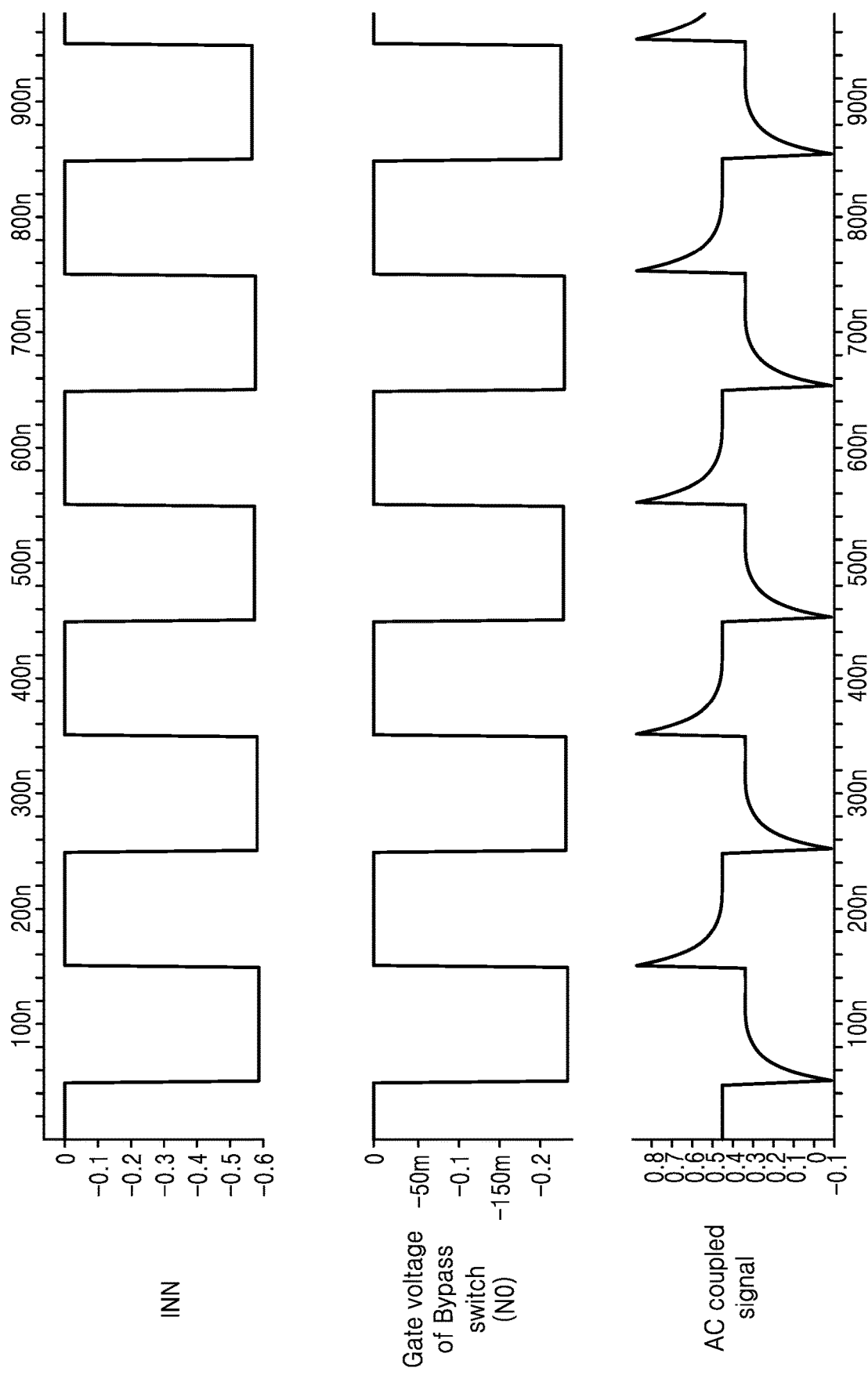
FIG. 10 illustrates variation of gate-voltage of the bypass-switch NO following the input-signal (e.g., source voltage), in accordance with an embodiment of the present subject matter.

FIG. 10 illustrates variation of gate-voltage of the bypass switch N0 following the input-signal (e.g., source voltage) for AC coupling mode. More specifically, the bypass switch N0 remains 'OFF' during negative-excursion, thereby preventing or reducing corrupted-output (e.g., distorted average). The bypass switch N0 remains OFF and accordingly an AC coupled version of INN is observed at the receiver 113. Similar is the scenario with INP as well.

Figure 11:
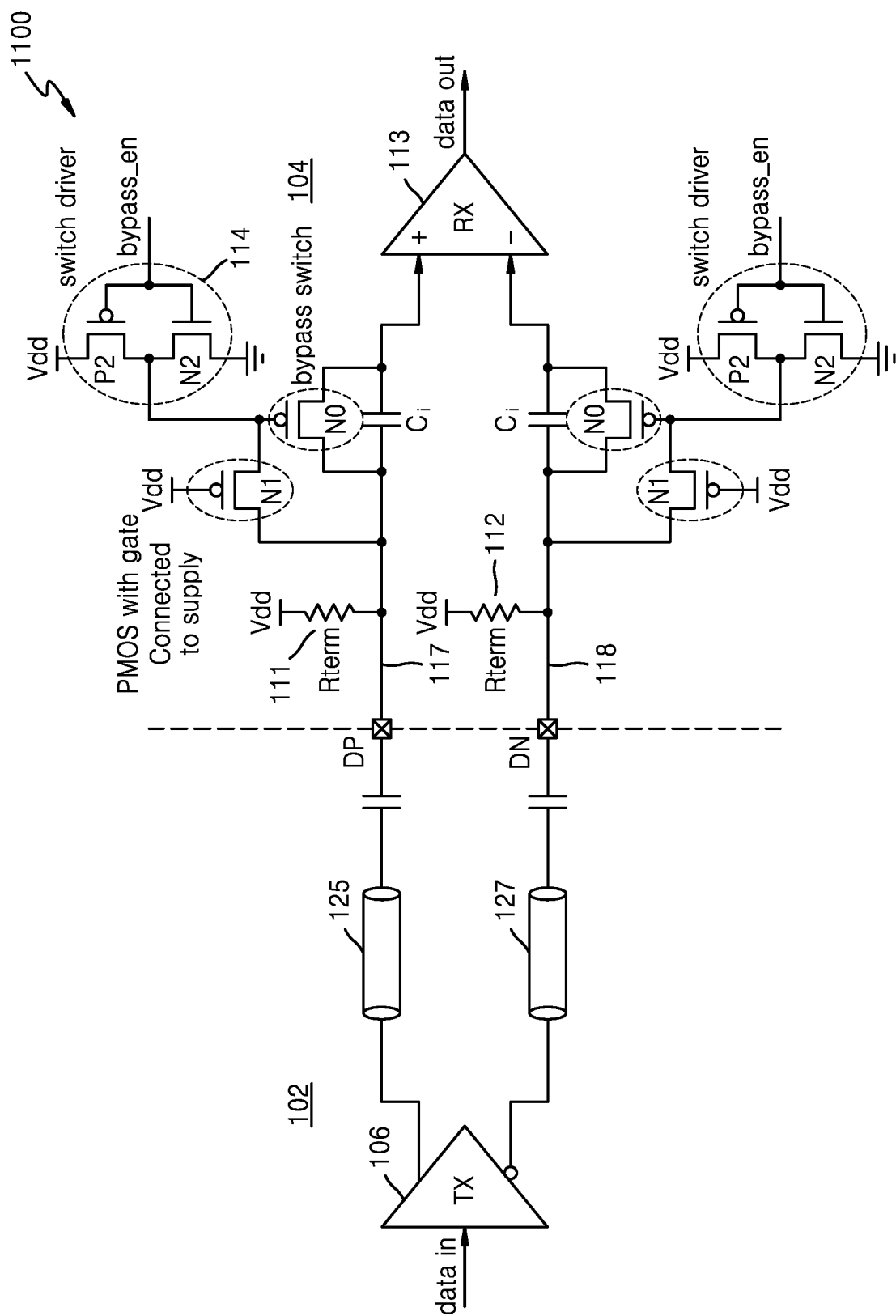
FIG. 11 is a schematic-diagram illustrating the Alternating Current (AC) and Direct Current (DC) coupled electronic receiving-system or the termination-network, in accordance with an embodiment of the present subject matter.

FIG. 11 is a schematic-diagram illustrating the Alternating Current (AC) and Direct Current (DC) coupled electronic receiving-system or the termination-network 1100 (also referred to herein as a "network," a "receiving termination network," a "termination-network," a "termination network" and/or a "receiver-termination network") analogous to the receiver-termination-network 100 illustrated in FIG. 4. However, unlike the receiver-termination-network 100 illustrated in FIG. 4, the termination network 1100 in FIG. 11 is supply-terminated, e.g., the termination resistors $R_{term}$ in the network are connected to supply and not grounded. Accordingly, the receiver termination network 1100 of FIG. 11 is supply terminated.

Again, the transistor N1 as provided between a source and a gate of the bypass switch N0 to maintain an 'OFF' state of the bypass switch N0 while the input (e.g., input 117 and/or 118) is AC-coupled and an 'ON' state of the bypass switch N0 when the input is DC-coupled. The bypass switch N0 may be similar to or the same as the bypass switch N0 with respect to the ground-terminated receiver termination network 100 of FIG. 4. In an example, the bypass switch N0 is configured as a CMOS Transmission Gate as shown in FIG. 5.

However, the transistor N1 in the present scenario of the supply-terminated network 1100 differs from FIG. 4. In an embodiment, the transistor N1 (also referred to herein as a "supply-connected to gate based transistor," and/or a "voltage-following transistor") is a p-channel transistor (e.g., pMOS) connected to the supply voltage Vdd. The pMOS during the OFF state may short source and gate terminals of the bypass transistor (N0) and thereby renders a conducting-path there-between.

In case of the aforesaid supply-termination in the present FIG. 11, the termination resistors 111 and 112 $R_{term}$ each may have a first-end coupled to the receiver system inputs 117 and 118, respectively, and a second end that is connected to supply voltage Vdd. The supply-termination may create positive-excursions (e.g., voltage spikes) during which the p-channel transistor N1 switches 'ON' to short 'gate' and 'source' terminals of the bypass switch N0 and thereby maintain a zero gate-source voltage with respect to the bypass switch (N0).

The p-channel transistor (N1) may be sized by a defined scale (for example, 4 times greater) with respect to the bypass switch (N0) and/or selected as a transistor having a low threshold-voltage from amongst a plurality of devices. Such configuration of the transistor N1 enables switching ON the transistor N1 prior to the bypass switch (N0) to maintain OFF state of the bypass switch (N0) during positive excursion at the receiver inputs 117 and/or 118.

In respect of the AC coupling of the receiver and presence of the supply connected to gate based transistor (N1), the transistor (P2) within the bypass switch driver circuit 114 (e.g., the inverter-circuit) may be sized in accordance with a defined criteria to enable the gate-voltage to follow the source-voltage in respect of the bypass switch (N0). The criteria may be defined as one or more of:

a) the transistor (P2) sized lower than the transistor (N1) to exhibit a lower drive-strength (as illustrated in FIG. 7A);

b) a resistance (e.g., resistor) provided in series with the transistor (P2) for lowering the drive-strength thereof in comparison to the transistor (N1) (as illustrated in FIG. 7B); and/or c) a resistor provided in series with the inverter-circuit (as illustrated in FIG. 8A).

In respect of the DC coupling of the receiver and presence of the supply connected to gate based transistor (N1), the transistor (N2) within the bypass switch driver circuit 114 (e.g., the inverter-circuit) may be sized in accordance with a defined criteria to enable the gate-voltage to follow the source-voltage and thereby maintain the gate-source voltage VGS with respect to the bypass switch (N0) within reliability-limits. The criteria may be defined as one or more of:

a) the transistor (N2) sized lower than the transistor (N1) to exhibit a lower drive-strength (as illustrated in FIG. 7A);

b) a resistance (e.g., resistor) provided in series with the transistor (N2) for lowering the drive-strength thereof in comparison to the transistor (N1); and/or c) a resistor (e.g., the resistor of sizing-criterion (c)) provided in series with the inverter-circuit (as illustrated in FIG. 8A).

Figure 12A:
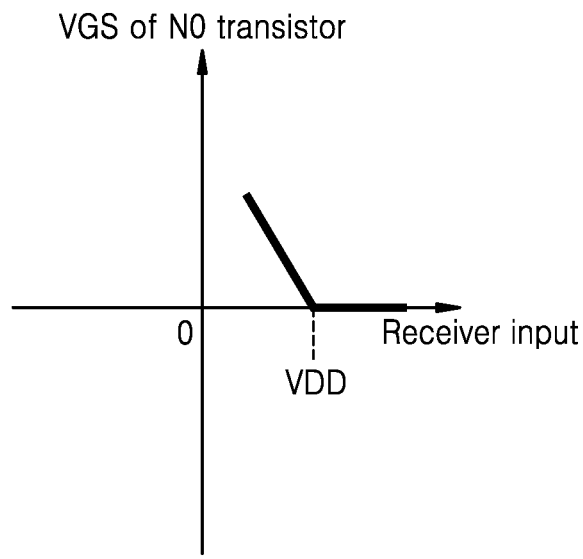
FIGS. 12A and 12B illustrate an example operation of the bypass switch NO, the 'supply connected to gate' based transistor and the bypass switch driver-circuit forming a part of the network in FIG. 11, in accordance with an embodiment of the present subject matter.
Figure 12B:
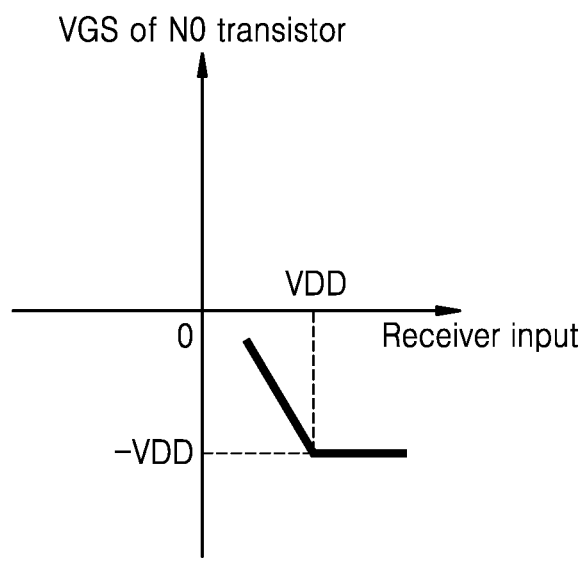

FIGS. 12A and 12B illustrate example operations of the bypass switch N0, the 'supply connected to gate' based transistor N1 and the bypass switch driver-circuit 114 forming a part of the network 1100 in FIG. 11. Such operations may be categorized as AC and DC modes of operation. The receiver input (e.g., input 117 and/or 118) acts as the source voltage for the bypass switch N0.

Under the AC mode of operation as depicted in FIG. 12A, the receiver input (e.g., input 117 and/or 118) (e.g., receiver input voltage) is lower than VDD and decreasing. The N1 transistor does not turn ON and remains OFF. The gate voltage of the bypass switch N0 is fixed at supply. As source voltage decreases, the VGS increases. When said receiver input (e.g., receiver input voltage) is higher than VDD and increasing, then the N1 transistor turns ON. Accordingly, the gate of the bypass switch N0 follows the source voltage, thereby rendering the gate-source voltage as zero and maintaining the OFF state of the bypass switch N0 during positive excursion.

Under DC mode of operation as depicted in FIG. 12B, the receiver input (e.g., input 117 and/or 118) (e.g., receiver input voltage) is lower than (e.g., has a lower voltage than) the supply voltage or VDD, and decreasing. The N1 transistor does not turn ON. Accordingly, the gate voltage of the bypass transistor N0 is fixed at 'zero'. As the source voltage or the receiver input decreases, then VGS increases. When the receiver input (e.g., receiver input voltage) is higher than VDD and increasing, then the N1 transistor turns ON. Accordingly, the gate voltage of the bypass transistor N0 follows the source voltage so that VGS is negative of supply and is accordingly kept within reliability limits during the positive excursion.

The aforesaid operation of FIGS. 12A and 12B may be summarized through the Table 2.

TABLE 2

| Mode | N0 | N1 | N2 | P2 | |
|---|---|---|---|---|---|
| AC mode | OFF | OFF | OFF | ON | N1 switched ON for positive excursions so that N0 gate & source are tracked |
| DC mode | ON | OFF | ON | OFF | |

Figure 13:
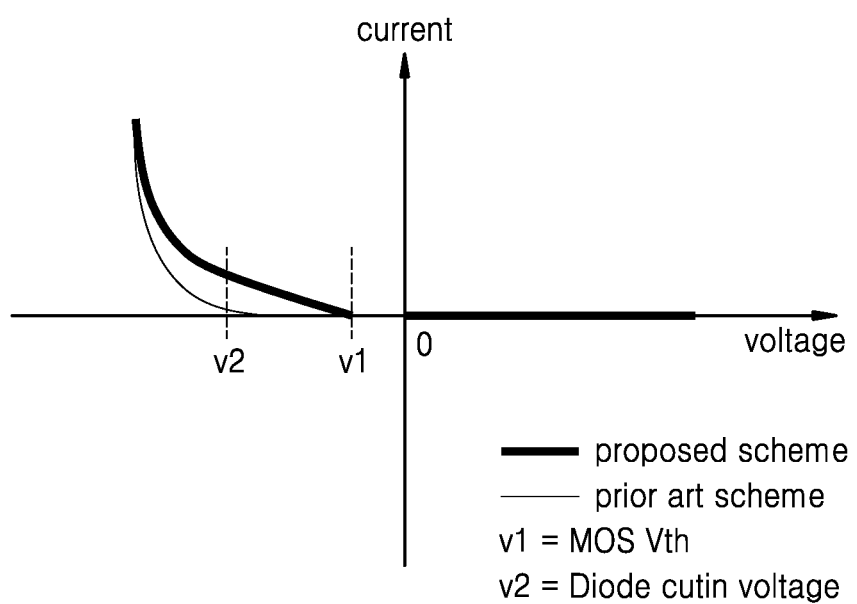
FIG. 13 illustrates a process of impedance-measurement with respect to the termination network as illustrated in FIG. 4 and FIG. 11.

FIG. 13 illustrates a process of impedance-measurement with respect to the termination networks 100 and 1100 as illustrated in FIG. 4 and FIG. 11. The process of impedance measurement involves disabling of the receiver and its termination. Thereafter, the voltage at the inverting and non-inverting ends (e.g., DP/DN voltage) is applied as sweep voltage. In an example and without limiting the scope of the present subject matter, a swept frequency sine waveform or multi-sine waveform may be used as the stimulus so that the impedance may be evaluated across a given frequency range of interest.

Based upon the stimuli provided in the form of the sweep voltage, the current through voltage source is measured. As shown in FIG. 13, a measured current for proposed scheme (e.g., the termination networks 100 and 1100) through DP/DN within a voltage range defined by V1 (e.g., MOS threshold voltage) to V2 (e.g., diode cut in voltage) is of the order of magnitude which is higher compared to prior art schemes.

Figure 14:
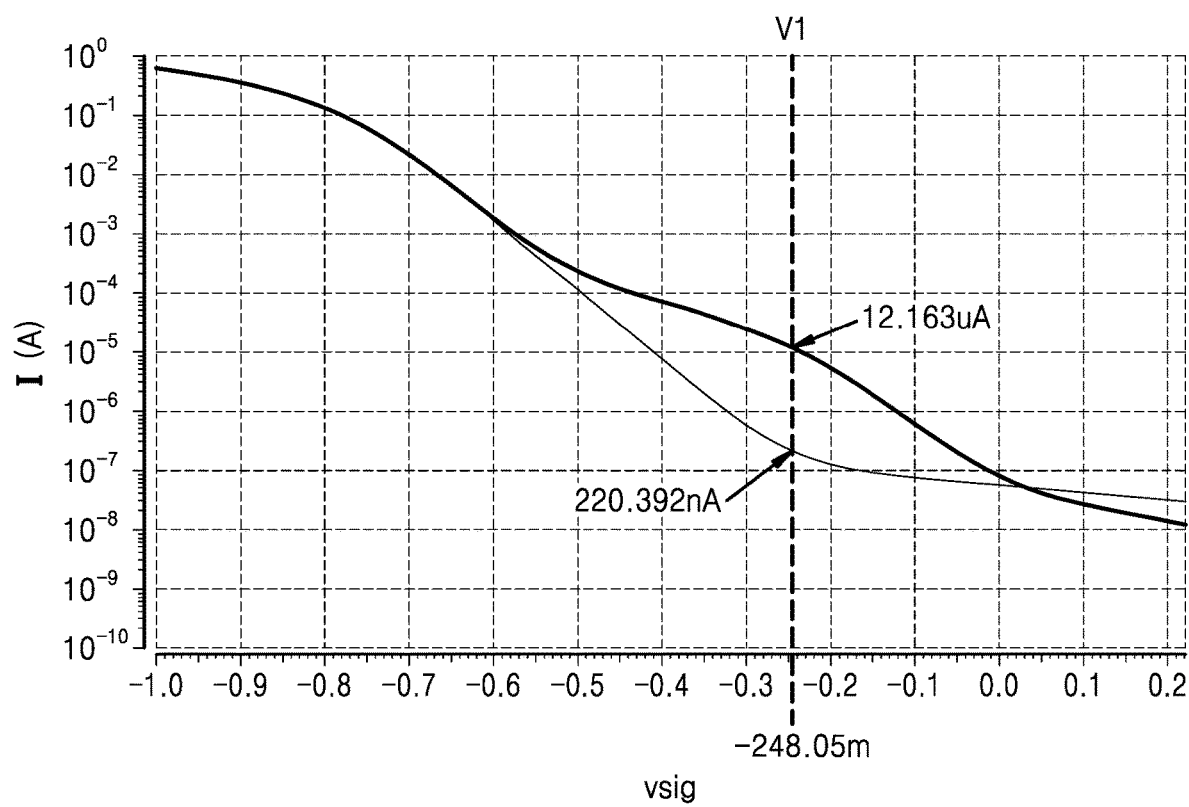
FIG. 14 illustrates a difference of current-flow in respect of the present subject matter with respect to the prior art schemes.

FIG. 14 illustrates a difference of current-flow between the proposed scheme (e.g., the present termination networks 100 and 1100) and the prior art schemes. As may be observed, with respect to a given voltage V1 that corresponds to the MOS threshold voltage, the measured current for proposed scheme is of the order of a magnitude which is higher compared to prior art schemes.

Figure 15:
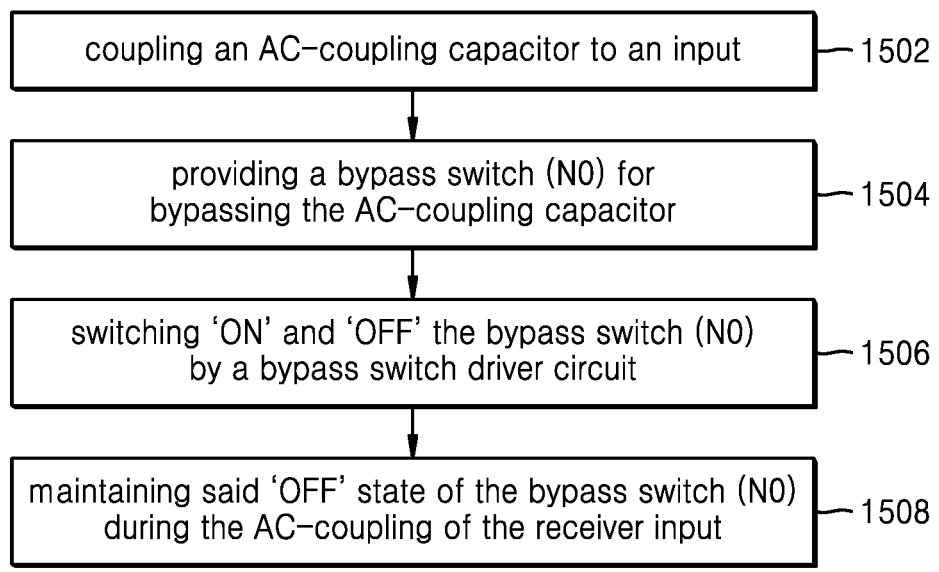
FIG. 15 illustrates a method of implementing Alternating Current (AC) and Direct Current (DC) coupling to constitute the receiver termination network, in accordance with an embodiment of the present subject matter.

FIG. 15 illustrates a method of implementing Alternating Current (AC) and Direct Current (DC) coupling to constitute the receiver termination network 100 and/or 1100 of FIG. 4 and/or FIG. 11.

Operation 1502 includes coupling an AC-coupling capacitor Ci to an input (e.g., input 117 and/or 118) of the receiver 113.

Operation 1504 includes providing a bypass switch (N0) configured to bypass the AC-coupling capacitor Ci.

Operation 1506 includes controlling a DC and AC-coupling of the receiver input by switching 'ON' and 'OFF' of the bypass switch (N0) through a bypass switch driver circuit 114.

Operation 1508 includes maintaining an 'OFF' state of the bypass switch (N0) during the AC-coupling of the receiver input by providing a grounded gate transistor (N1) or a supply-connected to gate based transistor (N1) between the source and gate of the bypass switch (N0).

Likewise, the method operation 1508 of FIG. 15 may be extended to cover a DC coupling based scenario during the ON state of the bypass switch (N0). More specifically, the operation 1508 may further include achieving variation of the gate-voltage of the bypass switch N0 in accordance with the receiver input (e.g., a source-voltage) to render a zero gate-source voltage VGS during negative or positive excursions of the input and thereby render said gate-source voltage VGS within reliability-limits.

At least by virtue of the aforesaid features, the present subject matter renders a significant improvement over the conventional techniques used to support AC-DC coupled links using the same receiver or a similar receiver. As technical shift is made to lower supply voltages, the conventional ON-chip AC/DC coupling mechanisms prove to be inadequate at least in respect of power, area, and/or performance of the receiver.

On the other hand, the present subject matter renders a mechanism for AC-DC coupled links with least impact on the power, area, and/or performance of the receiver while operating through low supply voltages. More specifically, the present subject matter renders a solution in term of designing low voltage serial input output receivers. In an example, the present receiver termination networks 100 and 1100 may be used for all receivers which support multiple protocols (AC & DC coupled links) and for Boundary Scan JTAG receivers (IEEE 1149.6).

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and/or services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated. In this description, a "computing entity" may be any computing system as previously defined in the present disclosure, or any module or combination of modulates running on a computing system.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for-purposes of example rather than limitation, and does not preclude inclusion of such modifications, variations, and/or additions to the present subject matter as would be readily apparent to one of ordinary skill in the art.

To the extent that method or apparatus embodiments herein are described as having certain numbers of elements, it should be understood that fewer than all of the elements may be necessary to define a complete claim. In addition, sequences of operations or functions described in various embodiments do not require or imply a requirement for such sequences in practicing any of the appended claims. Operations or functions may be performed in any sequence to effectuate the goals of some embodiments.

We claim:

1. An Alternating Current (AC) and Direct Current (DC) coupled electronic receiver system comprising:
   a receiver;
   an AC-coupling capacitor between an input of the receiver system and the receiver;
   a bypass switch configured to selectively bypass the AC-coupling capacitor to DC-couple the input to the receiver;
   a bypass switch driving circuit configured to:
      cause the bypass switch to switch 'ON' and thereby DC-couple the input to the receiver, and
      cause the bypass switch to switch 'OFF' and thereby AC-couple the input to the receiver; and
   a voltage-following transistor between a source and a gate of the bypass switch configured to maintain an 'OFF' state of the bypass switch while the input is AC-coupled.

2. The receiver system as claimed in claim 1, wherein the receiver is at least one of:
   an amplifier,
   a differential amplifier,
   a comparator, or
   a combination of comparator and amplifier.

3. The receiver system as claimed in claim 1, wherein the voltage-following transistor is at least one of:
   a grounded gate n-channel transistor, or
   a p-channel transistor having a gate connected to a supply voltage.

4. The receiver system as claimed in claim 1, further comprising:
   a termination resistor having a first end coupled to the input, and a second end that is grounded, the second end being configured to create a negative input excursion during an AC coupling mode, the voltage-following transistor being configured to switch 'ON' to short the source and the gate of the bypass switch during the negative input excursion and thereby maintain a zero gate-source voltage with respect to the bypass switch, the voltage-following transistor being an n-channel transistor.

5. The receiver system as claimed in claim 1, further comprising:
   a termination-resistor having a first end coupled to the input, and a second end coupled to a supply voltage, the second end being configured to create a positive input excursion during an AC coupling mode, the voltage-following transistor being configured to switch ON to short the source and the gate of the bypass switch during the positive input excursion and thereby maintain a zero gate-source voltage with respect to the bypass switch, the voltage-following transistor being a p-channel transistor.

6. The receiver system as claimed in claim 1, wherein the bypass switch is at least one of:
   an n-channel transistor,
   a p-channel transistor, or
   a complementary MOSFET (CMOS).

7. The receiver system as claimed in claim 4, wherein
   the voltage-following transistor is configured to be at least one of:
      selected as a transistor having a defined scale with respect to the bypass switch, or
      selected as a transistor having low threshold-voltage from amongst a plurality of devices, and
   the voltage-following transistor is configured to switch 'ON' prior to the bypass switch to maintain an 'OFF' state of the bypass switch during a negative or positive input excursion.

8. The receiver system as claimed in claim 7, wherein the voltage-following transistor is configured to short the source and gate of the bypass switch during an 'ON' state.

9. The receiver system as claimed in claim 1, wherein the bypass switch driving circuit is an inverter-circuit comprising:
   an n-channel inverter transistor; and
   a p-channel inverter transistor.

10. The receiver system as claimed in claim 9, wherein the bypass switch driving circuit is arranged in accordance with a first defined criteria to enable a gate-voltage of the bypass switch to follow a source-voltage, and when the receiver is AC coupled and the voltage-following transistor is a grounded gate transistor said first defined criteria includes one or more of
   the n-channel inverter transistor being sized lower than the voltage-following transistor,
   a first resistor in series with the n-channel inverter transistor, or
   a second resistor in series with the inverter-circuit, and
   the bypass switch driving circuit is arranged in accordance with a second defined criteria to enable the gate-voltage of the bypass switch to follow the source-voltage, and when the receiver is DC coupled and the voltage-following transistor is the grounded gate transistor said second defined criteria includes one or more of the p-channel inverter transistor being sized lower than the voltage-following transistor, a third resistor in series with the p-channel inverter transistor, and the second resistor in series with the inverter-circuit.

11. The receiver system as claimed in claim 9, wherein the bypass switch driving circuit is arranged in accordance with a first defined criteria to enable a gate-voltage of the bypass switch to follow a source-voltage, and when the receiver is AC coupled and the voltage-following transistor has a gate connected to a supply voltage said first defined criteria includes one or more of the p-channel inverter transistor being sized lower than the voltage-following transistor, a first resistor in series with the p-channel inverter transistor, or a second resistor in series with the inverter-circuit, and the bypass switch driving circuit is sized-arranged in accordance with a second defined criteria to enable the gate-voltage of the bypass switch to follow the source-voltage, and when the receiver is DC coupled and the gate of the voltage-following transistor is connected to the supply voltage said second defined criteria includes one or more of the n-channel inverter transistor being sized lower than the voltage-following transistor, a third resistor in series with the n-channel inverter transistor, or the second resistor in series with the inverter-circuit.

12. The receiver system as claimed in claim 1, wherein a gate-voltage of the bypass switch varies in line with source-voltage when the bypass switch selectively bypasses the AC-coupling capacitor to DC-couple the input to the receiver to render a zero gate-source voltage during a negative or positive input excursion of the input and thereby render said gate-source voltage within a voltage limit.

13. A method of implementing Alternating Current (AC) and Direct Current (DC) coupling in a receiver, the method comprising:

controlling DC and AC coupling of an input of the receiver by causing a bypass switch to switch to an 'ON' state and an 'OFF' state using a bypass switch driver circuit, the bypass switch being configured to bypass an AC-coupling capacitor coupled to the input; and causing the bypass switch to maintain the 'OFF' state during the AC coupling of the input using a voltage-following transistor between a source and a gate of the bypass switch, the voltage-following transistor being a grounded gate transistor or a transistor having a gate connected to a supply voltage.

14. The method as claimed in claim 13, further comprising:

causing a gate-voltage of the bypass switch to vary in accordance with the input, during the 'ON' state as part of the DC coupling, to render a zero gate-source voltage during a negative or positive input excursion and thereby render said gate-source voltage within a voltage limit, wherein the bypass switch driver circuit is an inverter-circuit comprising an n-channel inverter transistor and a p-channel inverter transistor.

15. The method as claimed in claim 14, further comprising:

arranging the bypass switch driving circuit in accordance with a first defined criteria to enable a gate-voltage of the bypass switch to follow a source-voltage, when the receiver is AC coupled and the voltage-following transistor is a grounded gate transistor said first defined criteria including one or more of the n-channel inverter transistor being sized lower than the voltage-following transistor, a first resistor in series with the n-channel inverter transistor, and a second resistor in series with the inverter-circuit; and arranging the bypass switch driving circuit in accordance with a second defined criteria to enable the gate-voltage of the bypass switch to follow the source-voltage, when the receiver is DC coupled and the voltage-following transistor is a grounded gate transistor said second defined criteria including one or more of the p-channel inverter transistor being sized lower than the voltage-following transistor, a third resistor in series with the p-channel inverter transistor, and the second resistor in series with the inverter-circuit.

16. The method as claimed in claim 14, further comprising:

arranging the bypass switch driving circuit in accordance with a first defined criteria to enable a gate-voltage of the bypass switch to follow a source-voltage, when the receiver is AC coupled and the voltage-following transistor has a gate connected to the supply voltage said first defined criteria including one or more of the p-channel inverter transistor being sized lower than the voltage-following transistor, a first resistor in series with the p-channel inverter transistor, and a second resistor in series with the inverter-circuit; and arranging the bypass switch driving circuit in accordance with a second defined criteria to enable the gate-voltage of the bypass switch to follow the source-voltage, when the receiver is DC coupled and the gate of the voltage-following transistor is connected to the supply voltage said second defined criteria including one or more of the n-channel inverter transistor being sized lower than the voltage-following transistor, a third resistor in series with the n-channel inverter transistor, and the second resistor in series with the inverter-circuit.

* * * * *